(12) United States Patent
Koike et al.

(10) Patent No.: US 6,345,903 B1
(45) Date of Patent: Feb. 12, 2002

(54) SURFACE-MOUNT TYPE EMITTING DIODE AND METHOD OF MANUFACTURING SAME

(75) Inventors: Akira Koike; Yoshio Murano; Koichi Fukasawa, all of Fujiyoshida (JP)

(73) Assignee: Citizen Electronics Co., Ltd., Yamanashi (JP)

(*) Notice: Subject to any disclaimer, the term of this patent is extended or adjusted under 35 U.S.C. 154(b) by 0 days.

(21) Appl. No.: 09/654,262

(22) Filed: Sep. 1, 2000

(51) Int. Cl.[7] ............................................. F21V 21/00
(52) U.S. Cl. ..................... 362/249; 362/800; 362/84; 362/256; 362/267; 362/293; 362/231; 313/512
(58) Field of Search ................................. 362/249, 800, 362/84, 255, 256, 267, 293, 307, 310, 311, 230, 231; 313/512

(56) References Cited

U.S. PATENT DOCUMENTS

| | | | | |
|---|---|---|---|---|
| 5,632,551 A | * | 5/1997 | Roney et al. | 362/249 |
| 5,655,826 A | * | 8/1997 | Kuono et al. | 362/24 |
| 5,808,592 A | * | 9/1998 | Mizutani et al. | 345/83 |
| 5,962,971 A | * | 10/1999 | Chen | 313/512 |

\* cited by examiner

Primary Examiner—Sandra O'Shea
Assistant Examiner—Ronald E. DelGizzi
(74) Attorney, Agent, or Firm—Browdy and Neimark

(57) ABSTRACT

Disclosed herein is a surface-mount type light emitting diode wherein a reflection frame is placed around a light emitting diode element mounted on an upper surface of a glass epoxy substrate, a first resin encapsulator mixed with a wavelength-converting material is charged into the reflection frame to seal the light emitting diode element, a second resin encapsulator and a third resin encapsulator used as a surface layer are stacked on an upper portion of the glass epoxy substrate including the reflection frame in layer form to seal the entirety of the first resin encapsulator, and an ultraviolet absorbent is mixed into at least a third resin encapsulator. A wavelength-converting material such as a luminescent material or the like becomes hard to be affected by externally-incoming ultraviolet radiation or the like, whereby the aging of the wavelength-converting material can be controlled.

8 Claims, 17 Drawing Sheets

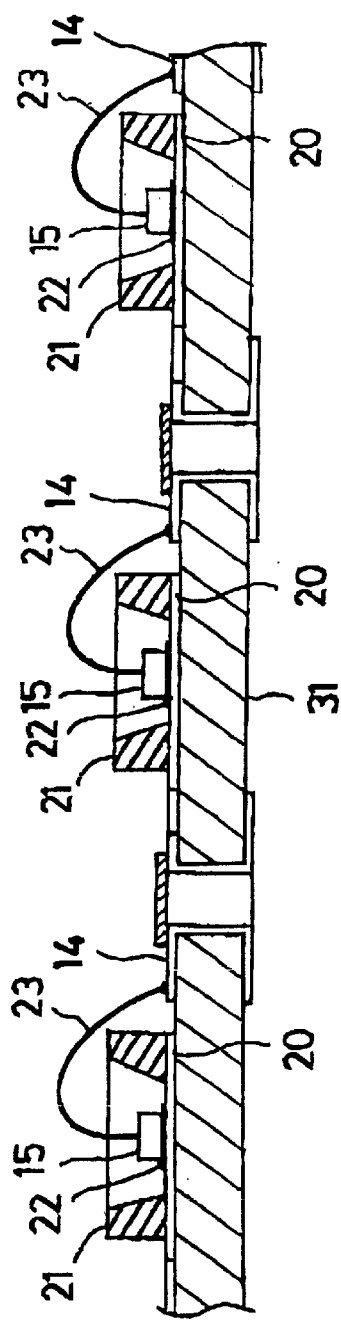
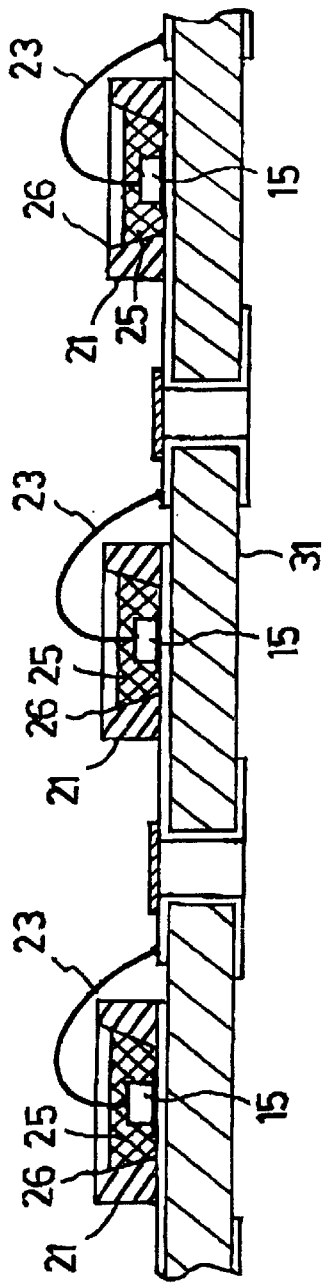

SURFACE-MOUNT TYPE EMITTING DIODE AND METHOD OF MANUFACTURING SAME

BACKGROUND OF THE INVENTION

1. Field of the Invention

The present invention relates to a surface-mount type light emitting diode surface-mountable on a motherboard and a method of manufacturing it, and particularly to a surface-mount type light emitting diode of such a type wherein a wavelength for a light emitting diode element is converted into another to charge a luminescent color.

2. Description of the Related Art

As this type of wavelength-conversion type light emitting diode, there has been known one shown in FIG. 1 by way of example (see JP-A No. H7-99345). This is a lead-frame type light emitting diode 1, which is one having a structure wherein a concave portion 3 is defined in a metal post 2 on one side of a lead frame, a light emitting diode element 4 is fit on and fixedly secured to the concave portion 3, and the light emitting diode element 4 and a metal post 5 on the other side of the lead frame are connected to each other by a bonding wire 6, whereas a resinous material 7 mixed with a wavelength-converting luminescent material or the like is charged into the concave portion 3 and the entire body thereof is sealed with a shell-shaped transparent epoxy resin 8. Since the wavelength of light emitted from the light emitting diode element 4 is wavelength-converted by the resinous material 7 charged into the concave portion 3, the light emitting diode 1 comprising such a structure is capable of applying luminescent light having a luminescent color different from the original luminescent color of the light emitting diode element 4.

However, the light emitting diode 1 wherein the whole body referred to above is simply sealed with the transparent epoxy resin 8, has a problem in that since the wavelength-converting luminescent material or the like mixed into the resinous material 7 has the property of being easy to age due to externally-incoming ultraviolet rays or the like, the luminescent material is susceptible to the externally-incoming ultraviolet radiation.

SUMMARY OF THE INVENTION

A first object of the present invention is to form a structure of a light emitting diode as a surface-mount type and allow the wavelength-converting material such as the luminescent material to be insusceptible to externally-incoming ultraviolet radiation or the like to thereby control aging of the wavelength-converting material.

A second object of the present invention is to avoid a reduction in the brightness of the light emitting diode due to the structure insusceptible to the ultraviolet radiation.

According to one aspect of the invention, for achieving the object, there is provided a surface-mount type light emitting diode, comprising a light emitting diode element placed on an upper surface of a glass epoxy substrate and having electrodes, a pair of electrodes formed on the glass epoxy substrate, a resin encapsulator for sealing an upper portion of the glass epoxy substrate, the electrodes and the pair of electrodes being connected to one another, a reflection frame placed around the light emitting diode element, a first resin encapsulator mixed with a wavelength-converting material, the first resin encapsulator being charged into the reflection frame to seal the light emitting diode element, a second resin encapsulator, a third resin encapsulator used as a surface layer, and an ultraviolet absorbent mixed into at least the third resin encapsulator, and wherein the second resin encapsulator and the third resin encapsulator are superimposed over the glass epoxy substrate including the reflection frame in layer form to seal the entirety of the first resin encapsulator.

In a surface-mount type light emitting diode according to another aspect of the present invention, an upper surface of the first resin encapsulator is placed in a position below an upper edge of the reflection frame.

In a surface-mount type light emitting diode according to a further aspect of the present invention, the wavelength-converting material mixed into the first resin encapsulator is a luminescent material comprising a fluorescent dye or fluorescent pigment.

In a surface-mount type light emitting diode according to a still further aspect of the present invention, the second resin encapsulator is mixed with a diffusing agent for diffusing wavelength-converted light.

In a surface-mount type light emitting diode according to a still further aspect of the present invention, the third resin encapsulator covers the entirety of the second resin encapsulator and is shaped in the form of a cap whose outer peripheral portion is bonded and fixed to the upper surface of the glass epoxy substrate.

In a surface-mount type light emitting diode according to a still further aspect of the present invention, a condenser lens portion is formed on an upper surface of the third resin encapsulator.

In a surface-mount type light emitting diode according to a still further aspect of the present invention, the light emitting diode element is a blue light emitting element comprised of a gallium-nitride system compound semiconductor or a silicon-carbide system compound semiconductor.

There is also provided a method of manufacturing a surface-mount type light emitting diode, comprising the following steps: a step for bonding and fixing a reflection-frame assembler to an upper surface of a glass epoxy assembled substrate with a pair of electrodes formed thereon, a step for placing light emitting diode elements inside reflection frames respectively and connecting electrodes of the light emitting diode elements and respective pairs of electrodes formed on the glass epoxy assembled substrate respectively, a step for charging a first resin encapsulator mixed with a wavelength-converting material into each of the reflection frames to thereby seal each of the light emitting diode elements, a step for sealing an upper portion of the glass epoxy assembled substrate including each reflection frame with a second resin encapsulator mixed with a diffusing agent, a step for sealing an upper surface of the second resin encapsulator with a third resin encapsulator mixed with an ultraviolet absorbent, and a step for cutting the glass epoxy assembled substrate along cut lines supposed thereon every sizes of substrates constituting light emitting diodes to thereby divide it into each individual light emitting diode.

According to such a configuration, since an ultraviolet absorbent is mixed into a surface-layer portion of a resin encapsulator, a wavelength-converting material provided close to a light emitting diode element becomes insusceptible to externally-incoming ultraviolet radiation or the like and hence the aging of the wavelength-converting material can be controlled.

Since the ultraviolet absorbent is mixed into the surface-layer portion of the resin encapsulator alone, there is no fear of a substantial reduction in the brightness of a light emitting diode due to its mixing.

Even when a plurality of surface-mount type light emitting diodes are placed adjacent to each other since an upper surface of a first resin encapsulator charged in a reflection frame is placed in a position lower than an upper edge of the reflection frame, light emitting from one light emitting diode can be blocked by an upper edge of a reflection frame of the other light emitting diode, and luminescent colors of both the light emitting diodes are not mixed together.

Since a diffusing agent is mixed into a second resin encapsulator, wavelength-converted light is diffused to obtain a luminescent color having uniformity.

Since the second resin encapsulator is covered with a third resin encapsulator shaped in cap form over its entirety, the wavelength-converting material placed therein becomes more insusceptible to externally-incoming ultraviolet radiation or the like.

Since a condenser lens portion is formed on an upper surface of the third resin encapsulator, light emitted from a light emitting diode element is gathered by the condenser lens portion to obtain high-brightness luminescence.

According to a manufacturing method of the present invention, since a large number of surface-mount type light emitting diodes can simultaneously be fabricated on a glass epoxy assembled structure, great cost-down can be achieved and a large economical effect is obtained. Further, the condenser lens portion is formed integrally with a resin encapsulator and automatic mounting to a motherboard is allowed. In addition to these, a reduction in the number of man-days, an improvement in yield, and an improvement in reliability or the like can be achieved.

The above-described features and advantages of the present invention will be described below in further detail with reference to the accompanying drawings.

BRIEF DESCRIPTION OF THE DRAWINGS

The present invention will be described with reference to the accompanying drawings in which:

FIG. 6 is a cross-sectional view depicting a process for placing light-emitting diode elements on the assembled substrate and wire-bonding them thereto;

FIG. 7 is a cross-sectional view showing a process for sealing each of the light-emitting diode elements placed on the assembled substrate with a first resin encapsulator;

DESCRIPTION OF THE PREFERRED EMBODIMENTS

Figure 1:
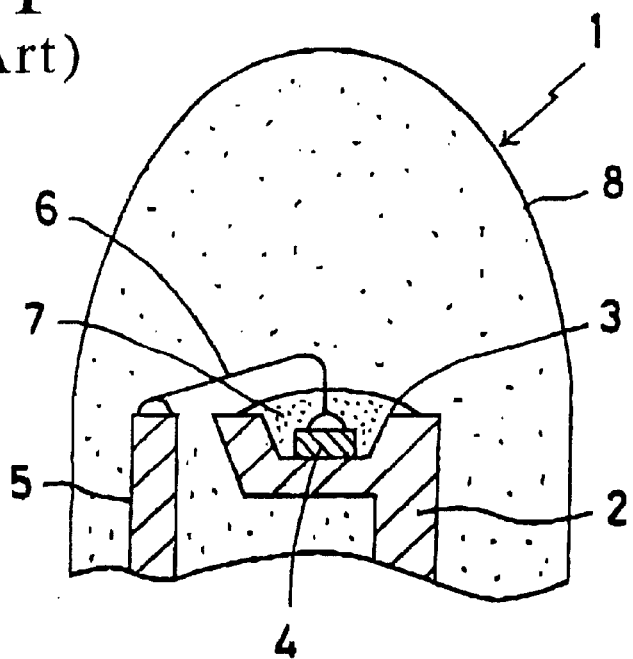
FIG. 1 is a cross-sectional view showing one example of a conventional wavelength conversion type light emitting diode.
Figure 2:
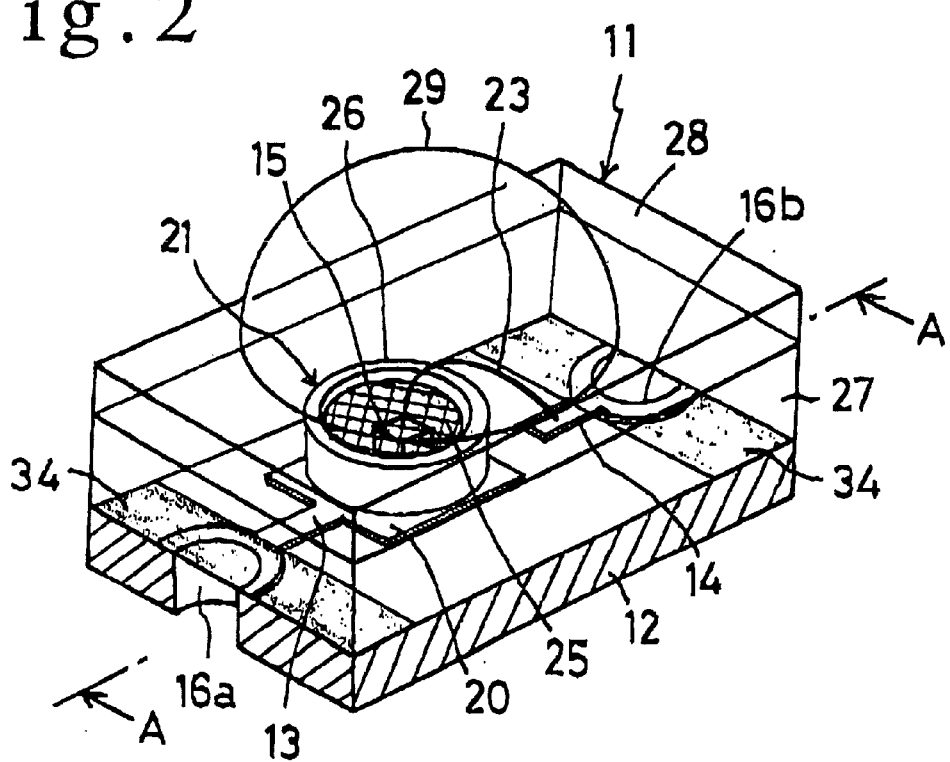
FIG. 2 is a perspective view illustrating a first embodiment of a surface-mount type light emitting diode according to the present invention.
Figure 3:
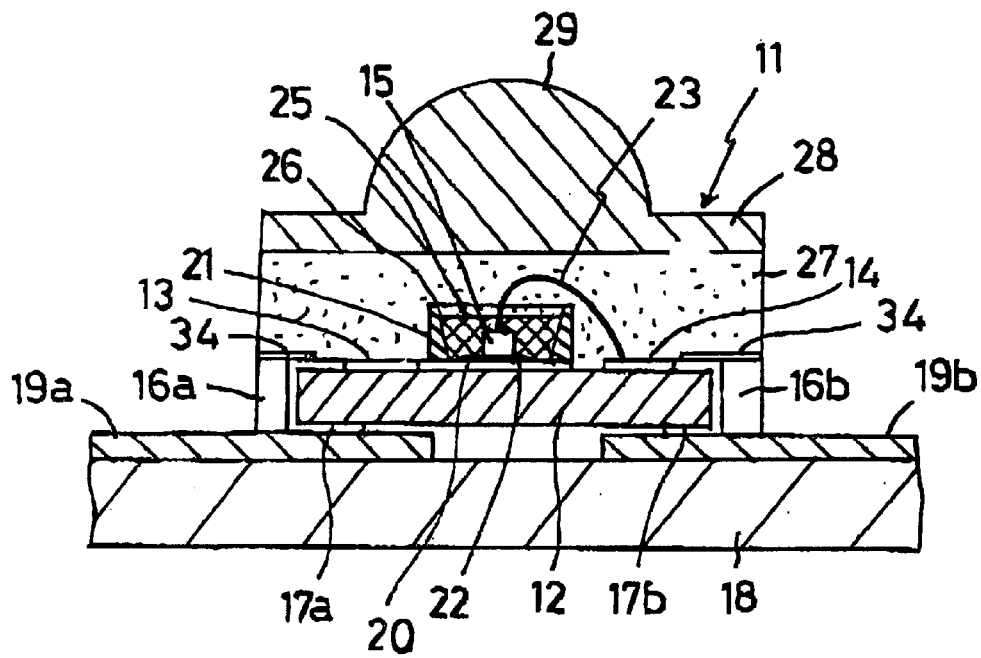
FIG. 3 is a cross-sectional view taken along line A—A in FIG. 2 at the time that the surface-mount type light emitting diode is mounted on a motherboard.

Preferred embodiments respectively showing surface-mount type light emitting diodes and methods of manufacturing the same, according to the present invention will hereinafter be described in detail with reference to the accompanying drawings. FIGS. 2 and 3 respectively show a first embodiment of a surface-mount type light emitting diode 11 according to the present invention. The surface-mount type light emitting diode 11 according to the present embodiment has a structure wherein a pair of electrodes (e.g., cathode and anode electrodes 13 and 14) is formed on an upper surface of a rectangular glass epoxy substrate 12 in patterns, a light emitting diode device or element 15 is implemented on one cathode electrode 13, and thereafter an upper portion thereof is sealed with a resin encapsulator. These electrodes 13 and 14 are wrapped around toward the back side via through-hole electrodes 16a and 16b provided at both ends of the glass epoxy substrate 12. Thus, conduction takes place between the back electrodes 17a and 17b and printed wirings 19a and 19b provided on a motherboard 18 as shown in FIG. 3. Incidentally, masking tapes 34 are bonded onto their corresponding upper surfaces of the through-hole electrodes 16a and 16b.

As also shown in FIGS. 2 and 3, the cathode electrode 13 extends to a central portion of the upper surface of the glass epoxy substrate 12, and the light emitting diode element 15 is bonded and fixed to a central electrode portion 20 thereof. A cylindrical reflection frame 21 is placed in the central electrode portion 20 so as to surround the light emitting diode element 15. An inner peripheral surface of the reflection frame 21 is inclined in conic form and has the function of reflecting light emitted from the light emitting diode element 15 over the inner peripheral surface thereof to thereby causing the light to converge in an upward direction. The inner peripheral surface is mirror-finished to improve the reflectivity of the light emitted from the light emitting diode element 15.

The light emitting diode element 15 placed within the reflection frame 21 is a small chip shaped in the form of a substantially cube and has electrodes provided at lower and upper surfaces thereof respectively. The undersurface electrode is bonded and fixed to the cathode electrode 13 placed within the reflection frame 21 with a conductive adhesive 22. On the other hand, the top-surface electrode is electrically connected to the anode electrode 14 by a bonding wire 23. The light emitting diode element 15 employed in the present embodiment is a blue light emitting element comprised of a silicon-carbide system compound semiconductor by may make use of a blue luminescent or light emitting element comprised of a gallium-nitride system compound semiconductor. Since no electrode exists in the lower surface of the light emitting element, it is necessary to connect both P and N electrodes to the cathode and anode electrodes 13 and 14 by bonding wires 23 respectively.

In the present embodiment, a first resin encapsulator 25 for sealing the light emitting diode element 15 is charged into the reflection frame 21. A wavelength-converting material excited by blue luminescence or luminescent light to thereby generate visible light having a long wavelength is mixed into the first resin encapsulator 25. For example, it is capable of transforming the blue luminescence into white and emitting its light. As the wavelength-converting material, may be used a luminescent material comprised of a fluorescent dye, a fluorescent pigment or the like. As the fluorescent dye, may be used, for example, an organic phosphor such as fluorescein, rhodamine or the like. Also as the fluorescent pigment, may be used an inorganic phosphor such as calcium tungstate or the like. Incidentally, a wavelength region to be converted can be adjusted by changing the amount of making of these luminescent materials. It is desirable that the amount of charge of the first resin encapsulator 25 is set to such a position that the upper surface thereof becomes lower than an upper edge 26 of the reflection frame 21 as shown in FIGS. 2 and 3 in the present embodiment. Thus, even when a plurality of the surface-mount type light emitting diodes 11 are placed adjacent to each other, light emitted from one light emitting diode can be blocked by the upper edge 26 of the reflection frame 21 of the other light emitting diode. It is therefore possible to prevent luminescent colors of both the light emitting diodes from being mixed together. Incidentally, an epoxy transparent resin is normally used as a resin material mixed with these luminescent materials.

The upper portion of the glass epoxy substrate 12 including the reflection frame 21 is sealed with a second resin encapsulator 27. The second resin encapsulator 27 is also comprised of the epoxy transparent resin as a principal component and is shaped in the same flat form as the glass epoxy substrate 12 with a certain degree of thickness. The second resin encapsulator 27 allows a wavelength-converted luminescent color to be transmitted through the fist resin encapsulator 25 as it is and may also use the epoxy transparent resin singly. However, a diffusing agent such as aluminium oxide, silicon dioxide or the like can be mixed into the epoxy transparent resin to obtain a luminescent color having more uniformity.

In the present embodiment as well, a third resin encapsulator 28 is stacked over the second resin encapsulator 27 in layered form. An ultraviolet absorbent such as derivatives salicylate, 2-hydroxybenzophenone derivative or the like is mixed into the third resin encapsulator 28. The ultraviolet absorbent blocks ultraviolet rays incident from outside to thereby lessen the influence of the ultraviolet rays on the first resin encapsulator 25 and control aging of the mixed luminescent material. The third resin encapsulator 28 has the same planar form as the second resin encapsulator 27 but is thinner than the second resin encapsulator 27 in thickness. This is because since the third resin encapsulator 28 aims to prevent the aging of the luminescent material due to the ultraviolet rays, the thin thickness of the third resin encapsulator 28 will suffice even though it is thin if the third resin encapsulator 28 is capable of effectively blocking the ultraviolet rays, and when the thickness of the third resin encapsulator 28 is excessively thick, a luminous intensity is lowered.

In the present embodiment, a semi-spherical condenser lens portion 29 is formed at the central portion of the upper surface of the third resin encapsulator 28 integrally therewith in protruded form. The condenser lens portion 29 is located above the reflection frame 21 and serves as a convex lens for condensing or gathering light emitted from the light emitting diode 15, which is upwardly reflected by the inner peripheral surface of the reflection frame 21. Namely, the light emitted from the light emitting diode 15 is divided into ones which upwardly travel in straight lines as they are and ones which are reflected by the inner peripheral surfaces of the reflection frame 21, and thereafter move in an upward direction. Since, however, any light is wavelength-converted by the first resin encapsulator 25 and gathered by the condenser lends portion 29 after the luminescent color is made uniform by the second resin encapsulator 27, high-intensity white luminescent light or luminescence is obtained. No particular limitations are imposed on the curvature radius, form ad reflectivity of the condenser lens portions 29 within a range in which light-gathering is obtained. Incidentally, the third resin encapsulator 28 might not be provided wit the condenser lens portion 29.

As shown in FIG. 3, the surface-mount type light emitting diode 11 configured as described above can directly be mounted on the upper surface of the motherboard 18. Namely, the surface-mount type light emitting diode 11 is upwardly placed on the printed wirings 19a and 19b formed on the upper surface of the motherboard 18, and the back electrodes 17a and 17b provided on both sides of the glass epoxy substrate 12 as viewed in the left and right directions are bonded to each other by solder, whereby the implementation of such a vertical dimension-limited light emitting diode is completed. The light converted from the blue luminescence or luminescent light to the white luminescence or luminescent light is emitted from the surface-mount type light emitting diode 11 implemented on the motherboard 28 in this way without discoloring while having upward directivity.

Figure 4:
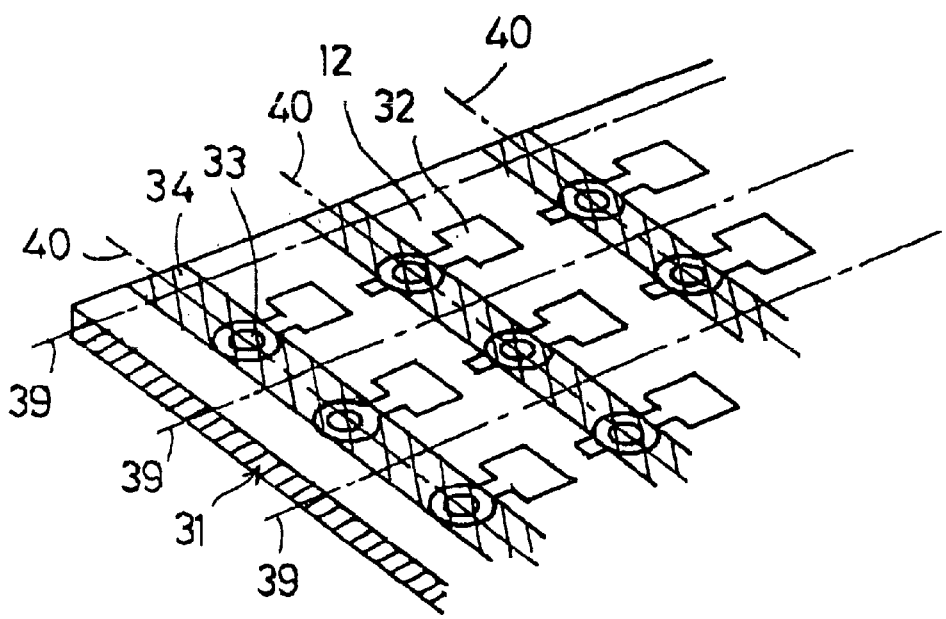
FIG. 4 is a perspective view showing an electrode pattern forming process used when the surface-mount type light emitting diode is fabricated by an assembled substrate.

FIGS. 4 through 10 respectively show a method of manufacturing the surface-mount type light emitting diode 11 having the above configuration. The present manufacturing method is a method of simultaneously manufacturing a large number of light emitting diodes by using an assembled substrate. FIG. 4 shows a process for forming electrode patterns 32 constituting cathode and anode electrodes and flute-shaped through holes 33 constituting through holes electrodes on a glass epoxy assembled substrate 31 every individual glass epoxy substrates 12 referred to above, and for blocking the flute-shaped through holes 33 with masking tapes 34.

Figure 5:
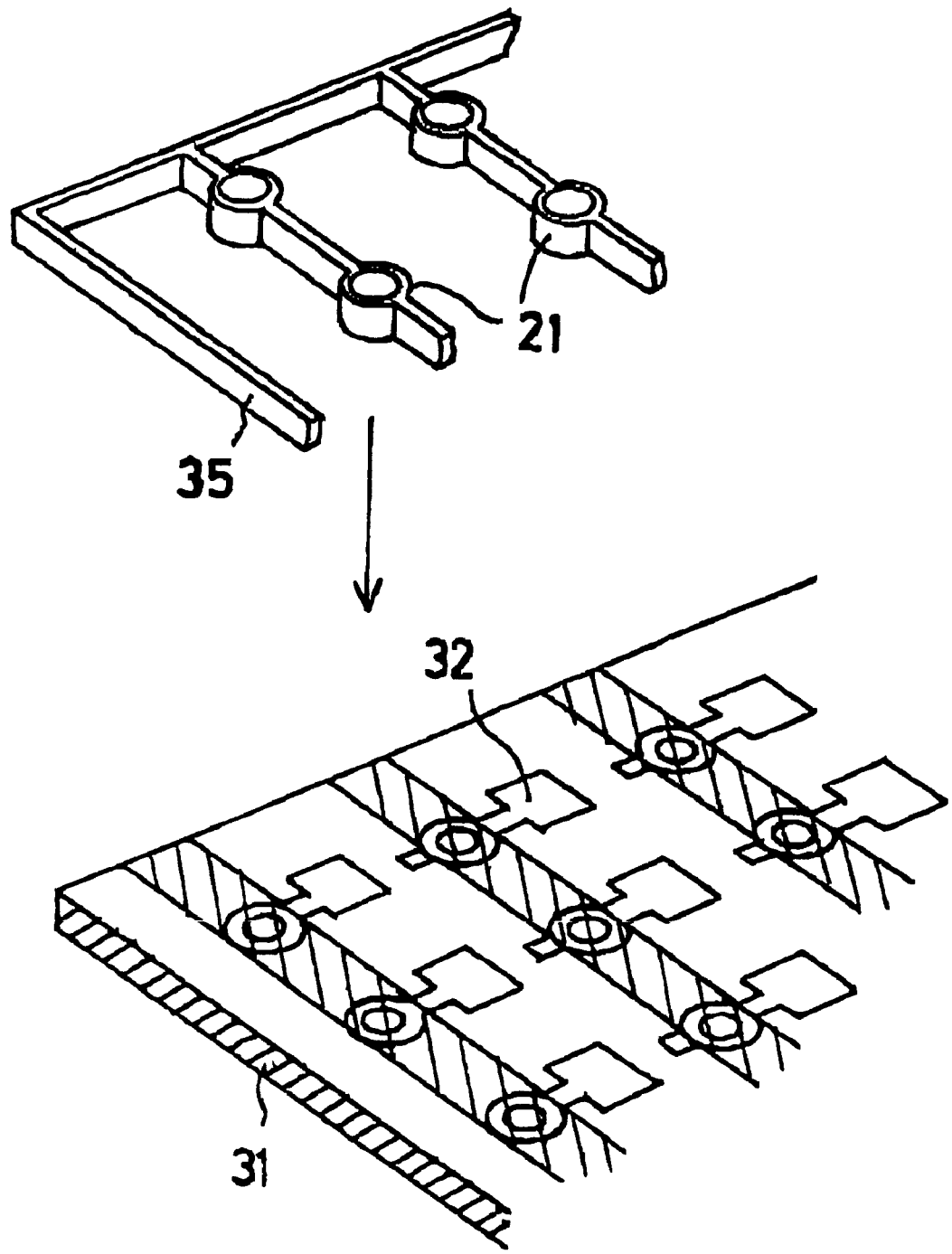
FIG. 5 is a perspective view illustrating a process for placing a reflection-frame assembler on the assembled substrate.

FIG. 5 shows a process for positioning a reflection-frame assembler 35 to the upper surface of the glass epoxy assembled substrate 31, placing reflection frames 21 on their predetermined positions of the electrode patterns 32, and bonding and fixing them thereto.

In the next process, as shown in FIG. 6, the light emitting diodes 15 are placed within their corresponding reflection frames 21 of the glass epoxy assembled structure 31, and their lower surfaces are fixedly secured to their corresponding central electrode portions 20 with a conductive adhesive 22. After the light emitting diodes 15 have been inserted into a cure furnace and fixed, the upper electrodes of the light emitting diode elements 15 and the anode electrodes 14 of the glass epoxy substrates 12 are respectively connected to one another by bonding wires 23.

FIG. 7 shows a process for sealing first resin encapsulators 25. In the present sealing process, the first resin encapsulators 25 mixed with luminescent materials are respectively poured into their corresponding reflection frames 21 and charged therein up to the positions where the upper surfaces of the light emitting diode elements 15 are hidden. It should be noted that the upper surfaces of the first light emitting diode elements 15 do not extend up to the upper edges 26 of the reflection frames 21 upon charging respectively. The first region encapsulators 25 are put into the cure furnace after their charging to thereby thermoset the first resin encapsulators 25.

Figure 8:
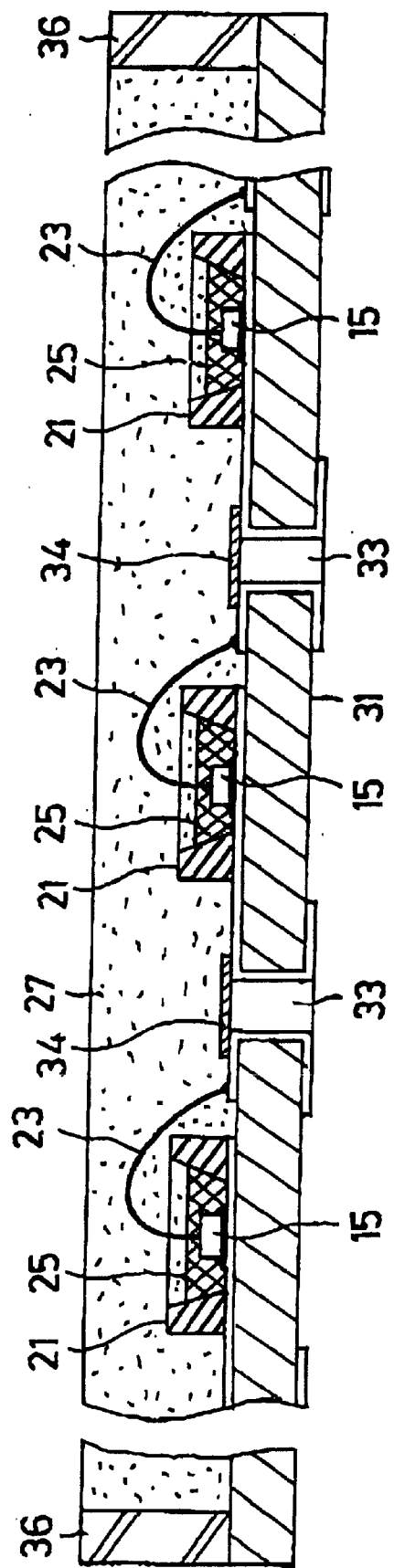
FIG. 8 is a cross-sectional view illustrating a process for sealing an upper portion of the assembled substrate with a second resin encapsulator.

FIG. 8 shows a process for sealing a second resin encapsulator 27. In the present sealing process, a mold die 36 is placed around the upper surface of the glass epoxy assembled substrate 31. The second resin encapsulator 27 is poured into the mold die 36 to seal the entire upper surface of the glass epoxy assembled substrate 31 simultaneously. Since the upper surfaces of the flute-shaped through holes 33 are blocked with their corresponding masking tapes 34, no second resin encapsulator 27 flows into the through holes 33. In this condition, the glass epoxy assembled substrate 31 is inserted into the cure furnace to thermoset the second resin encapsulator 27.

Figure 9:
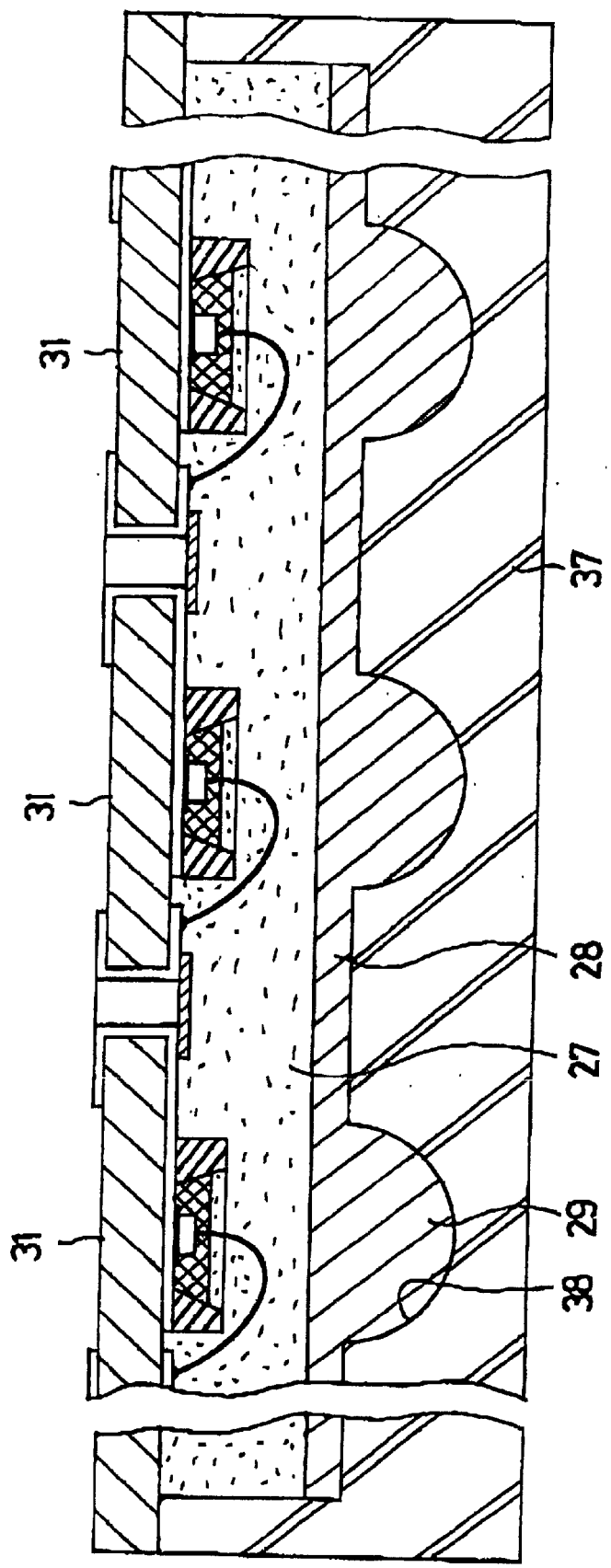
FIG. 9 is a cross-sectional view showing a process for sealing an upper portion of the second resin encapsulator with a third resin encapsulator.

FIG. 9 shows a process for sealing a third resin encapsulator 28. In the present sealing process, another mold die 37 is prepared in which semi-spherical concave portions 38 for forming condenser lens portions 29 integrally therewith are formed. Further, the third resin encapsulator 28 is charged into the concave portions 38. The glass epoxy assembled substrate 31 is faced down and inserted into the cure furnace in a state in which the third encapsulator 28 and the second resin encapsulator 27 are brought into contact with each other, thereby thermosetting the third resin encapsulator 28.

Figure 10:
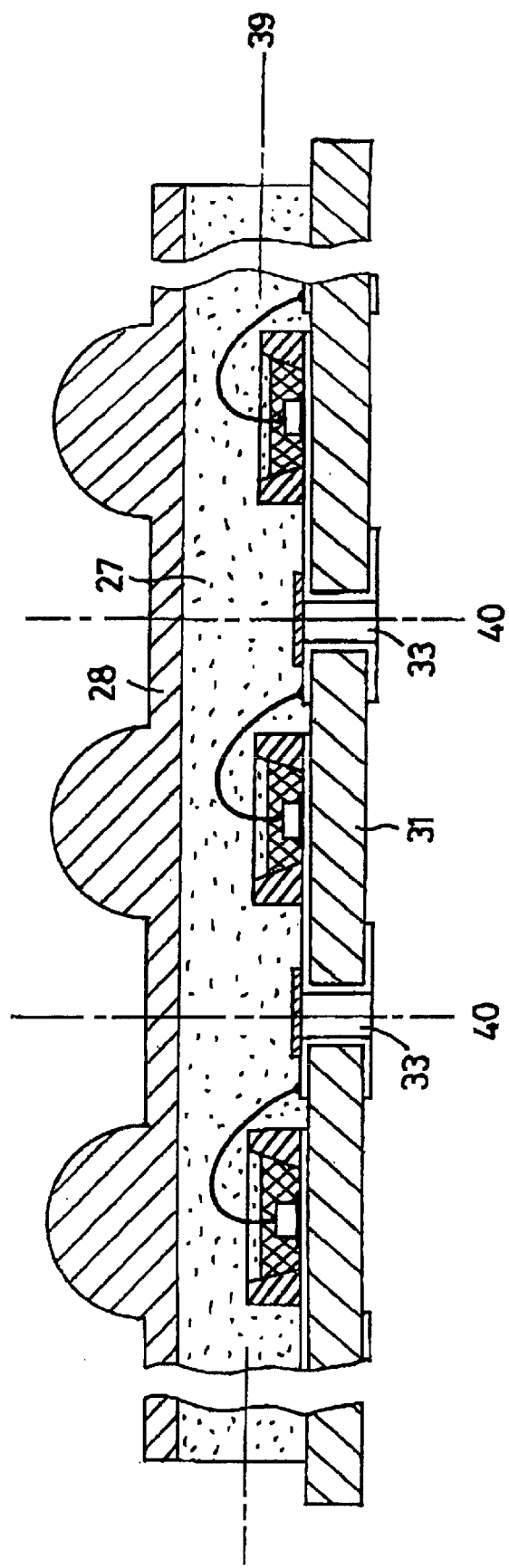
FIG. 10 is a sectional explanatory view showing the manner in which the assembled substrate is divided along cut lines extending in X and Y directions.

FIG. 10 shows a process subsequent to the extraction of the glass epoxy assembled substrate 31 from the cure furnace. The glass epoxy assembled substrate 31 sealed with the second resin encapsulator 27 and the third encapsulator 28 is diced or sliced in square form along cut lines 39 and 40 extending in X and Y directions. As shown in FIGS. 4 and 10, the cut lines 39 extending in the X direction correspond to lines taken along the longitudinal directions of the electrode patterns 32, whereas the cut lines 40 extending in the Y direction correspond to lines formed on the flute-shaped through holes 33. Each individual surface-mount type light emitting diodes 11 divided in this way are absorbed under vacuum by an automatic mount machine (not shown) so as to be transferred onto the motherboard 18.

Figure 11:
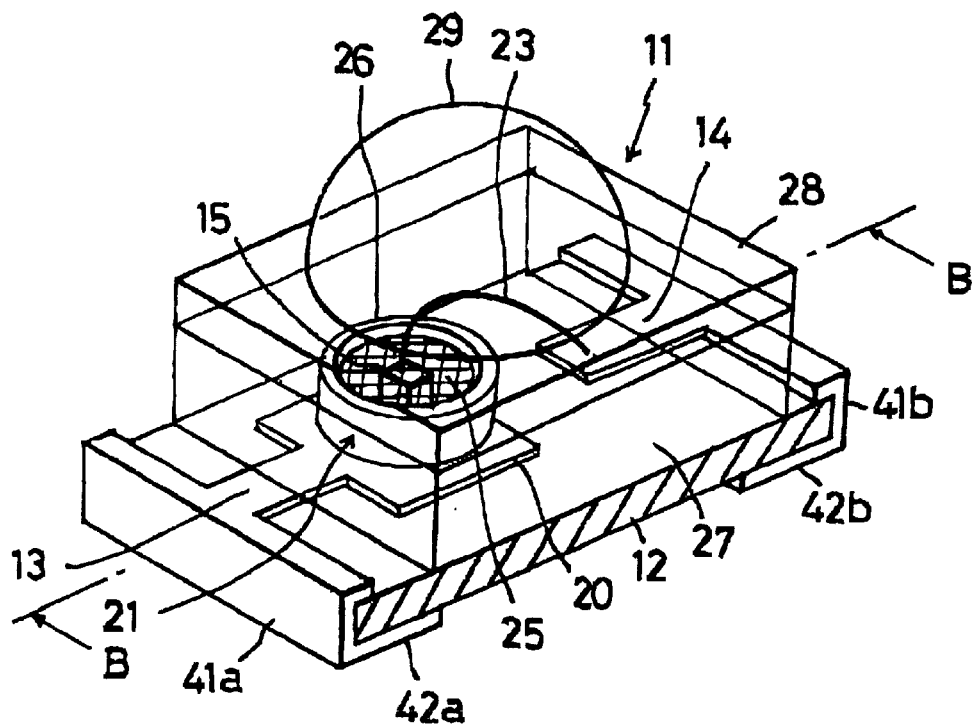
FIG. 11 is a perspective view illustrating a second embodiment of a surface-mount type light emitting diode according to the present invention.
Figure 12:
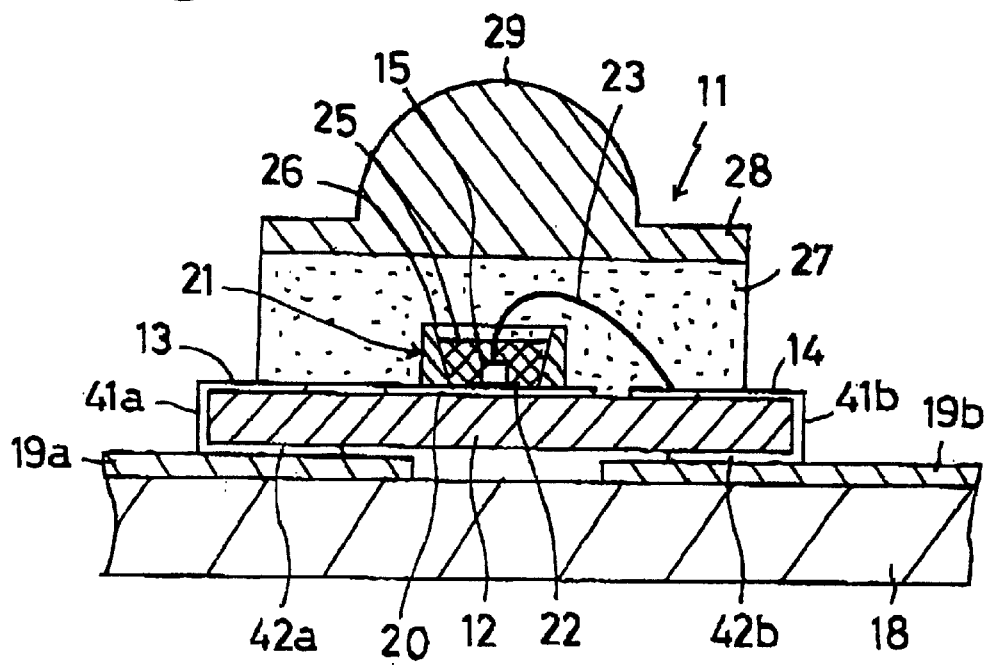
FIG. 12 is a cross-sectional view taken along line B—B in FIG. 11 at the time that the surface-mount type light emitting diode is implemented on a motherboard.

FIGS. 11 and 12 show a second embodiment of a surface-mount type light emitting diode 11 according to the present invention. The surface-mount type light emitting diode 11 according to the present embodiment is different from the previous embodiment in that side electrodes 41a and 41b, which constitute cathode and anode electrodes 13 and 14 on the sides of a glass epoxy substrate 12, are respectively provided over their entire side widths and extend to back electrodes 42a and 42b as they are. With their provision, a second resin encapsulator 27 and a third resin encapsulator 28 are provided in a state in which both sides of the upper surface of the glass epoxy substrate 12 are partly exposed. Incidentally, since the present surface-mount type light emitting diode is identical in configuration to the surface-mount type light emitting diode according to the previous embodiment and has similar operation and effects. Therefore, other elements of structure are identified by like reference numerals and their detailed description will therefore be omitted.

Figure 13:
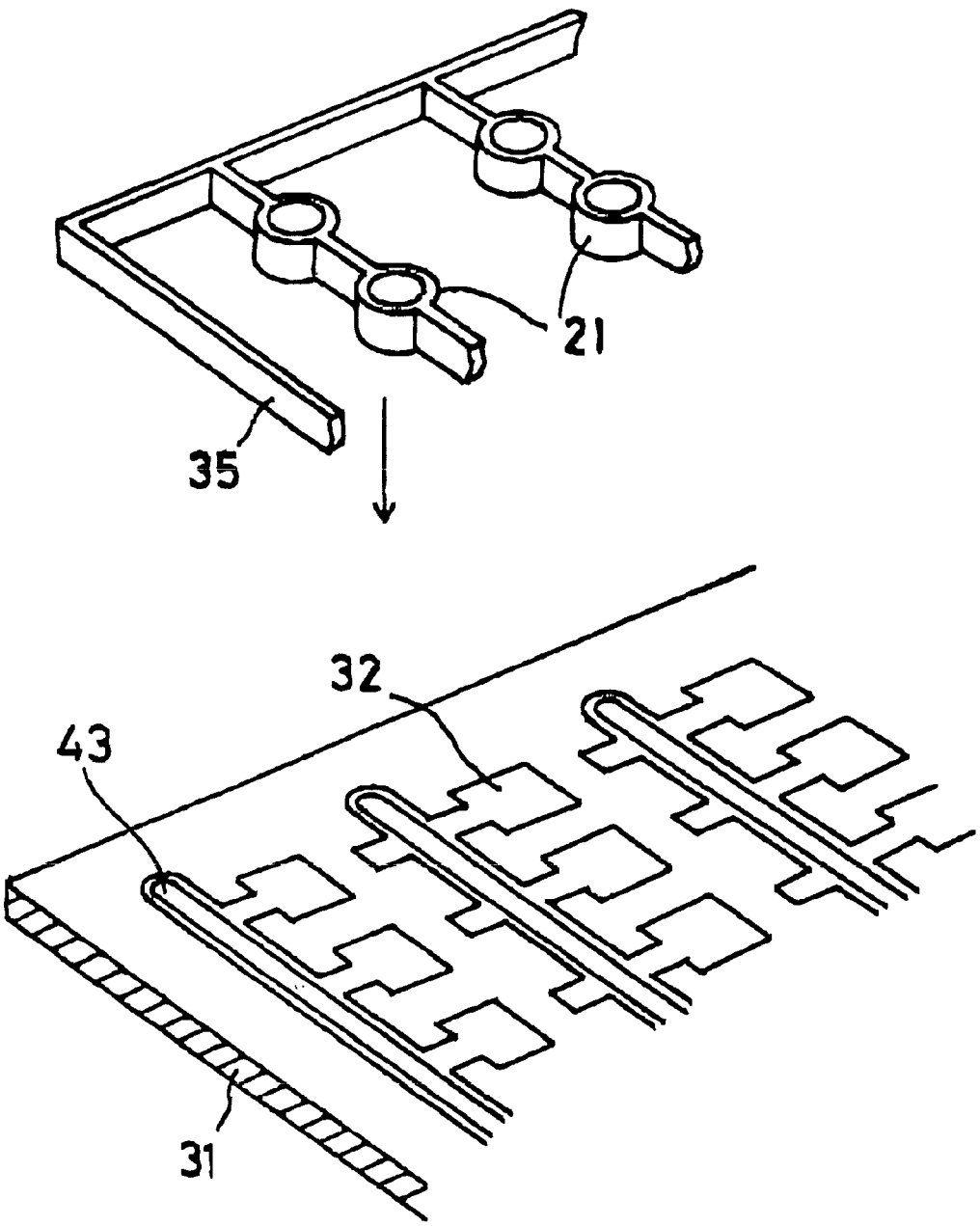
FIG. 13 is a perspective view showing an electrode pattern forming process and a process for placing a reflection-frame assembler, which are used to manufacture the surface-mount type light emitting diode by an assembled substrate.

FIGS. 13 through 16 show a method of manufacturing each individual surface-mount type light emitting diodes 11 according to the second embodiment. The manufacturing method in this case is also basically similar to that according to the previous embodiment. As shown in FIG. 13, similar electrode patterns 32 are formed on a glass epoxy assembled substrate 31 but elongated through holes 43 are defined as distinct from the previous embodiment. In this case, no masking tapes are required. Further, a reflection-frame assembler 35 is positioned to an upper surface of the glass epoxy assembled substrate 31 and thereafter respective reflection frames 21 are bonded and fixed onto their corresponding electrode patterns 32.

Since a process for placing light emitting diode elements 15 within their corresponding reflection frames 21 and wire-bonding them and a process for encapsulating first resin encapsulators 25 in the reflection frames are identical to those employed in the first embodiment shown in FIGS. 6 and 7, the description thereof will be omitted.

Figure 14:
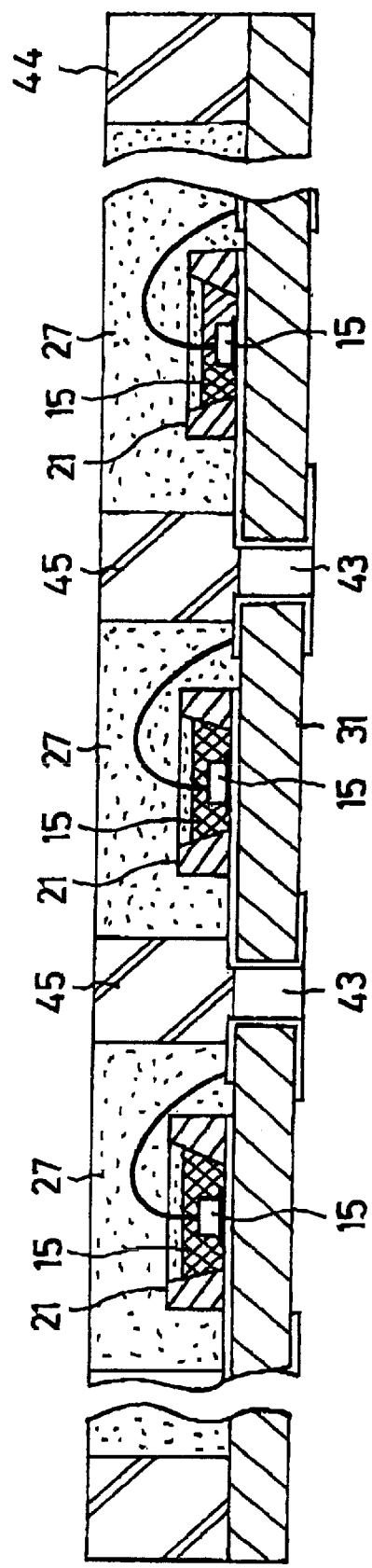
FIG. 14 is a cross-sectional view illustrating a process for sealing an upper portion of the assembled substrate with a second resin encapsulator.

FIG. 14 shows a process for placing a mold die 44 on the upper surface of the glass epoxy assembled substrate 31 and charging a second resin encapsulator 27 therein. However, the present mold die 44 is different in shape from that employed in the previous embodiment. Namely, the mold die 44 has mold masks 45 at positions corresponding to their elongated through holes 43 as well as surrounding of the outer periphery of the glass epoxy assembled substrate 31. The mold masks 45 respectively block the upper surfaces of the elongated through holes 43. The transverse width of each mold mask 45 is larger than that of each elongated through hole 43. Therefore, when the second resin encapsulator 27 is charged inside the mold die 44, the second resin encapsulator 27 does not flow into the elongated through holes 43 and is formed at a position slightly away from the edge of each elongated through hole 43.

Figure 15:
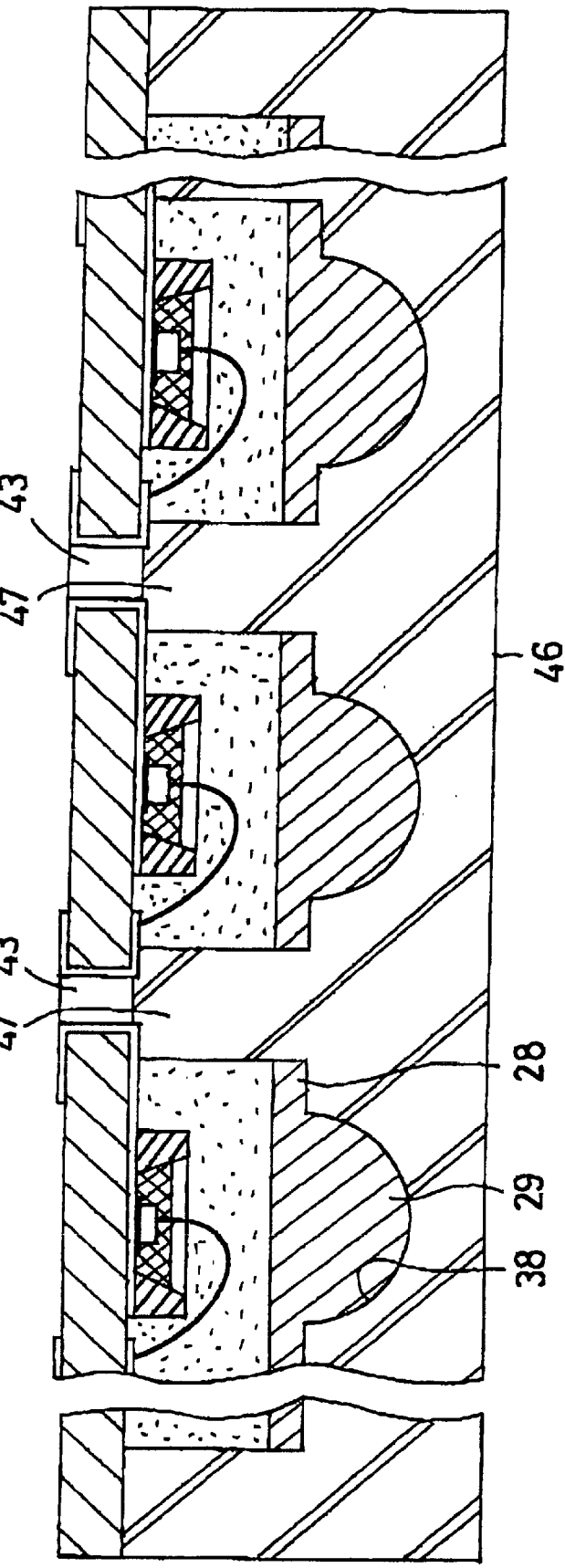
FIG. 15 is a cross-sectional view depicting a process for sealing an upper portion of the second resin encapsulator with a third resin encapsulator.

FIG. 15 shows a process for sealing a third encapsulator 28. A mold die 46 in which concave portions 38 for integrally forming condenser lens portions 29 are formed, is used in a manner similar to the previous embodiment. However, the present mold die 46 is also provided with mold mask portions 47 for respectively blocking elongated through holes 43 in a manner similar to the previous mold die 44 but is different therefrom in that the mold mask portions 47 prevent the flow of the third resin encapsulator 28 into each elongated through hole 43.

Figure 16:
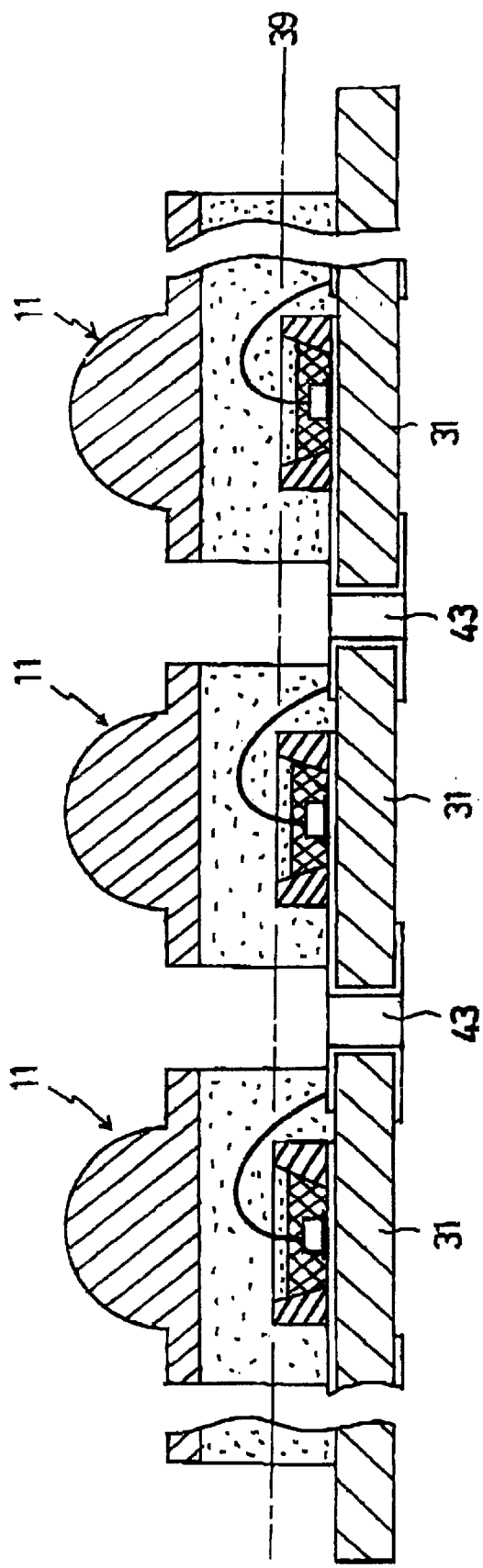
FIG. 16 is a sectional explanatory view showing the manner in which the assembled substrate according to the second embodiment is divided along cut lines extending in an X direction.

FIG. 16 shows a process for cutting the glass epoxy assembled substrate 31. As district from the previous embodiment, the glass epoxy assembled surface 31 can be divided into each individual surface-mount type light emitting diodes 11 by simply dicing or slicing it along cut lines 39 extending in an X direction. Namely, since a Y direction corresponds to each elongated through hole 43 and is divided from the beginning, no cutting is required.

Figure 17:
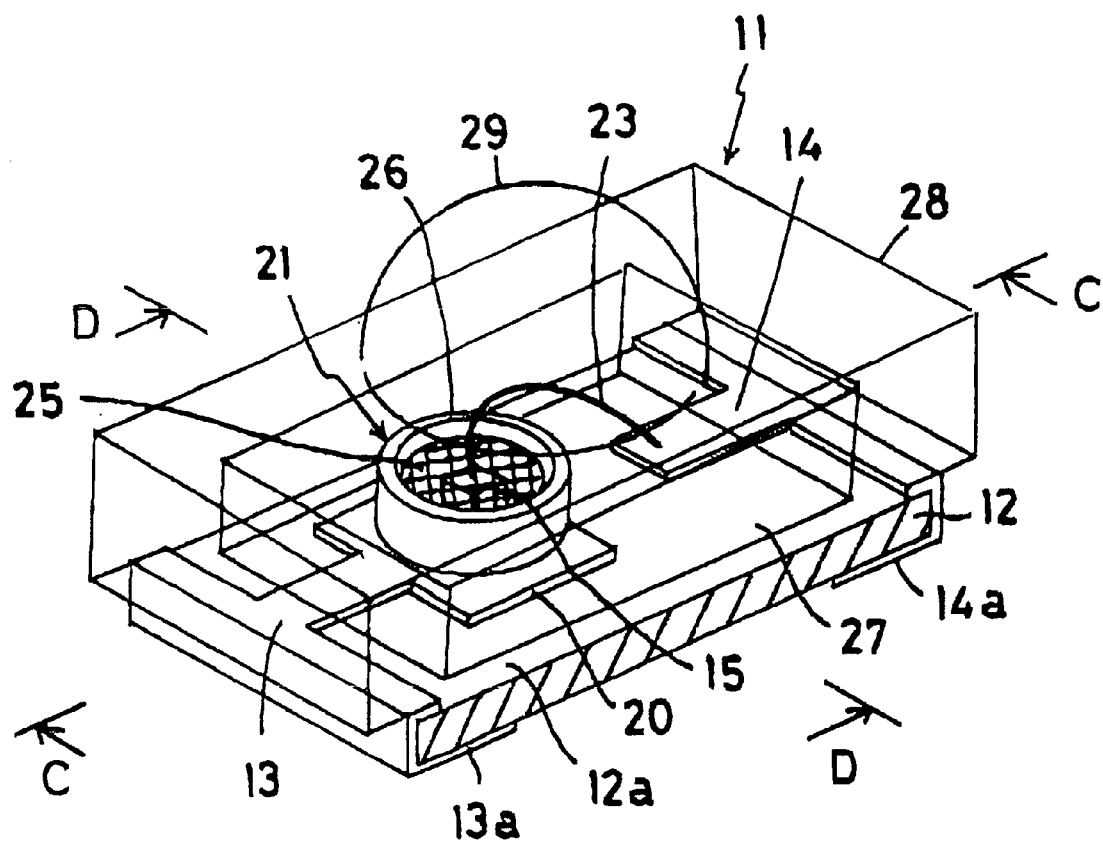
FIG. 17 is a perspective view illustrating a third embodiment of a surface-mount type light emitting diode according to the present invention.
Figure 18:
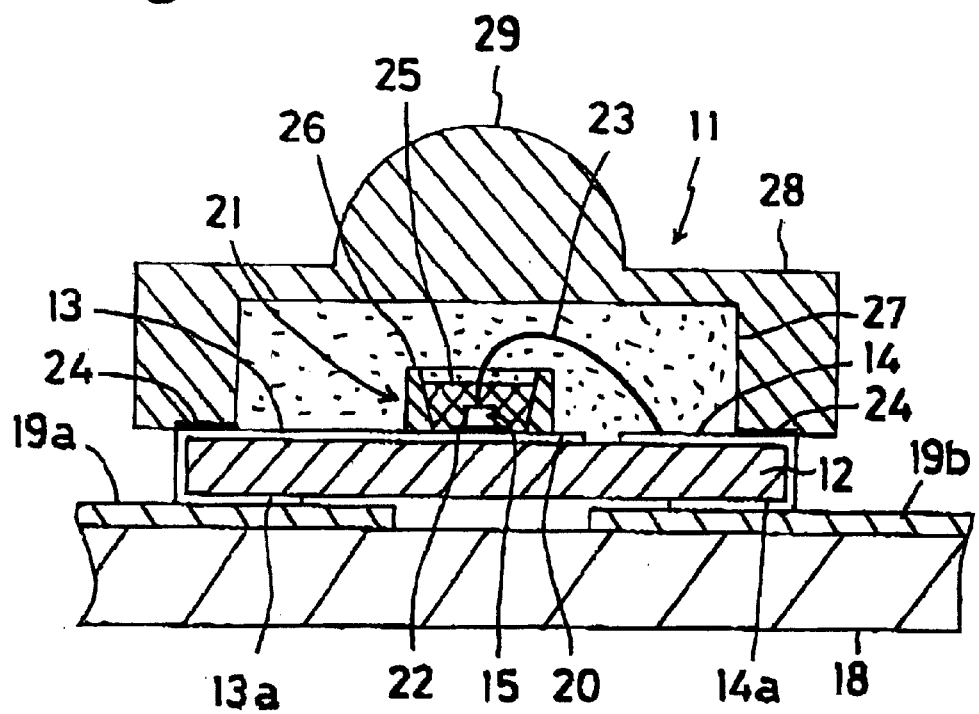
FIG. 18 is a cross-sectional view taken along line C—C in FIG. 17 at the time that the surface-mount type light emitting diode is implemented on a motherboard.
Figure 19:
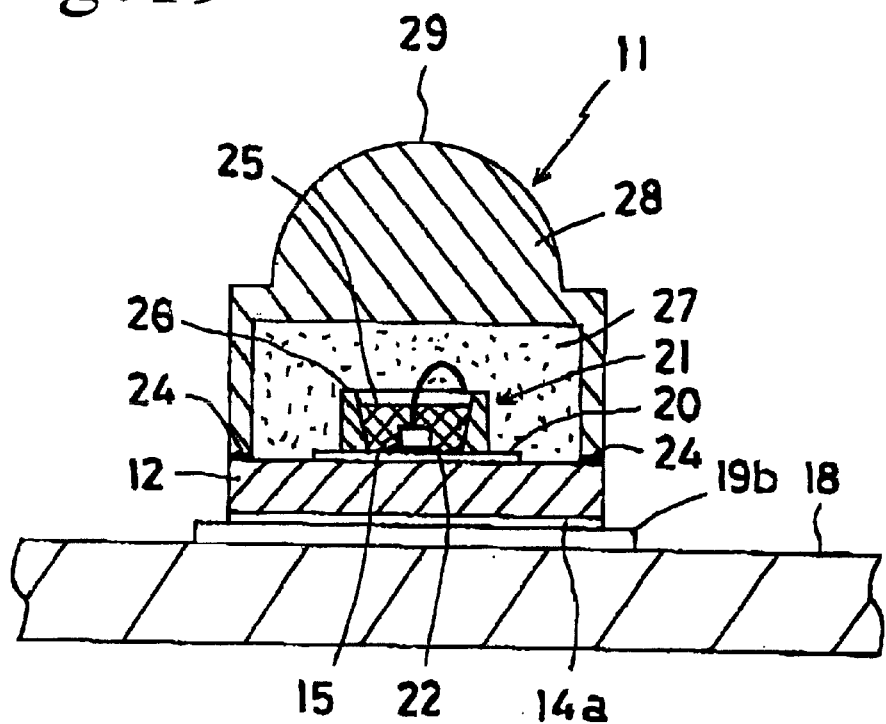
FIG. 19 is a cross-sectional view taken along line D—D of FIG. 17.
Figure 20:
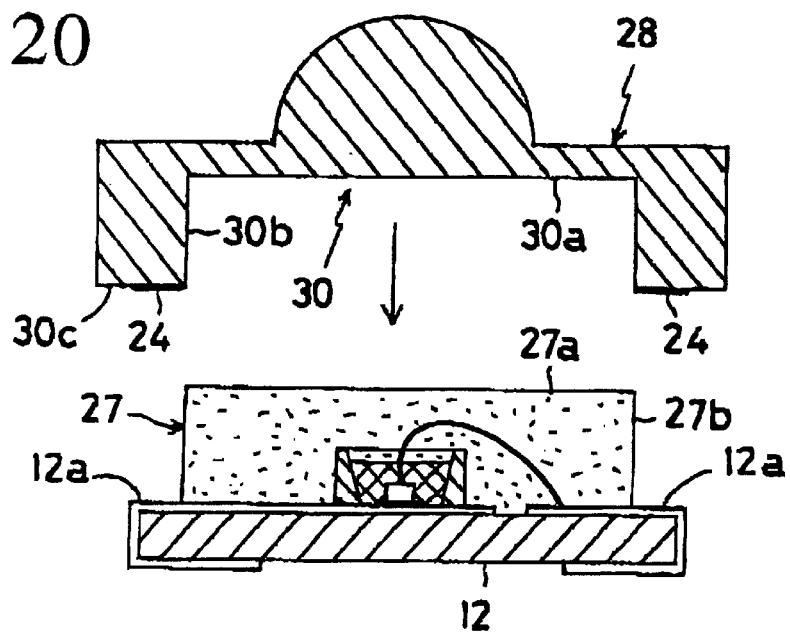
FIG. 20 is a cross-sectional view showing the manner in which a third resin encapsulator produced in another process is placed on a second resin encapsulator.

FIGS. 17 through 19 show a third embodiment of a surface-mount type light emitting diode 11 according to the present invention. The surface-mount type light emitting diode 11 according to the present embodiment takes a structure in which the entire second resin encapsulator 27 is covered with its corresponding third resin encapsulator 28 in the second embodiment. Namely, the second resin encapsulator 27 is formed in a state in which an outer peripheral portion 12a of an upper surface of a glass epoxy substrate 12 is exposed. On the other hand, the third resin encapsulator 28 is formed in another process as shown in FIG. 20 and shaped in the form of cap having a concave portion 30 placed on an upper surface 27a and a peripheral side 27 of the second resin encapsulator 27. The concave portion 30 forms a space corresponding the shape of the second resin encapsulator 27 by using an upper wall surface 30a and side wall surfaces 30b. When the concave portion 30 is fit on the second resin encapsulator 27, it is brought into close contact with its outer peripheral surface. Further, an adhesive 24 is applied to a lower wall surface 30c of the third resin encapsulator 28 over its entirety. When the third resin encapsulator 28 is placed on the second resin encapsulator 27, it is bonded and fixed to the outer peripheral portion 12a of the upper surface of the glass epoxy substrate 12. Incidentally, since the present surface-mount type light emitting diode is identical in configuration to the surface-mount type light emitting diode according to the previous embodiment and has similar operation and effects. Therefore, other elements of structure are identified by like reference numerals and their detailed description will therefore be omitted.

Figure 21:
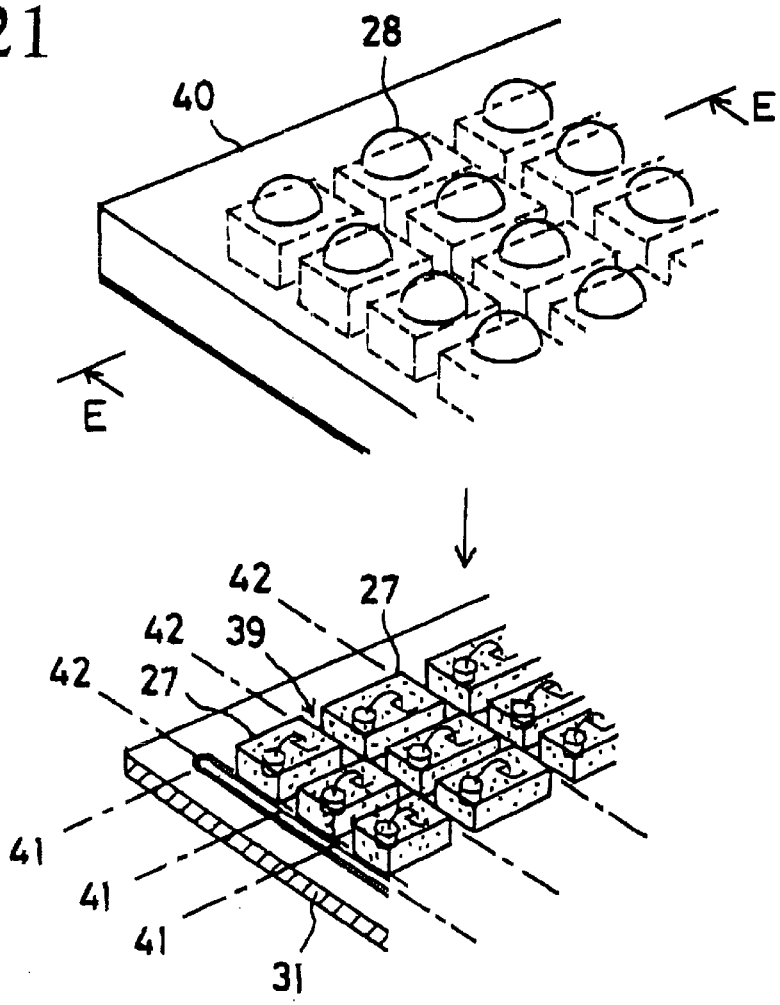
FIG. 21 is a perspective view illustrating a process for sealing an upper portion of each second resin encapsulator at the time that the surface-mount type light emitting diode is fabricated by an assembled substrate, with a third resin encapsulator.
Figure 23:
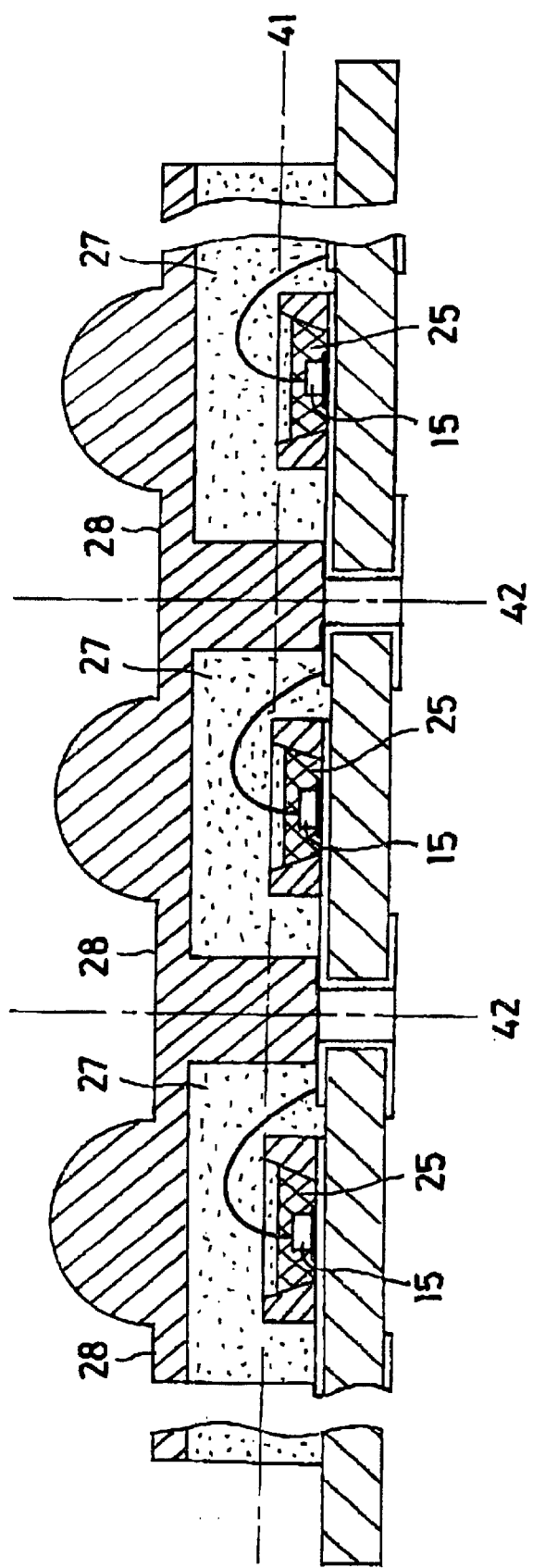
FIG. 23 is a sectional explanatory view showing the manner in which the assembled substrate according to the third embodiment is divided along cut lines extending in X and Y directions

FIGS. 21 and 23 show a method of manufacturing the surface-mount type light emitting diode 11 according to the third embodiment. Incidentally, since the present manufacturing method is similar to the second embodiment up to a process for sealing each second resin encapsulator 27, the detailed description thereof will be omitted. A description will be made from a process for sealing each third resin encapsulator 28.

Figure 22:
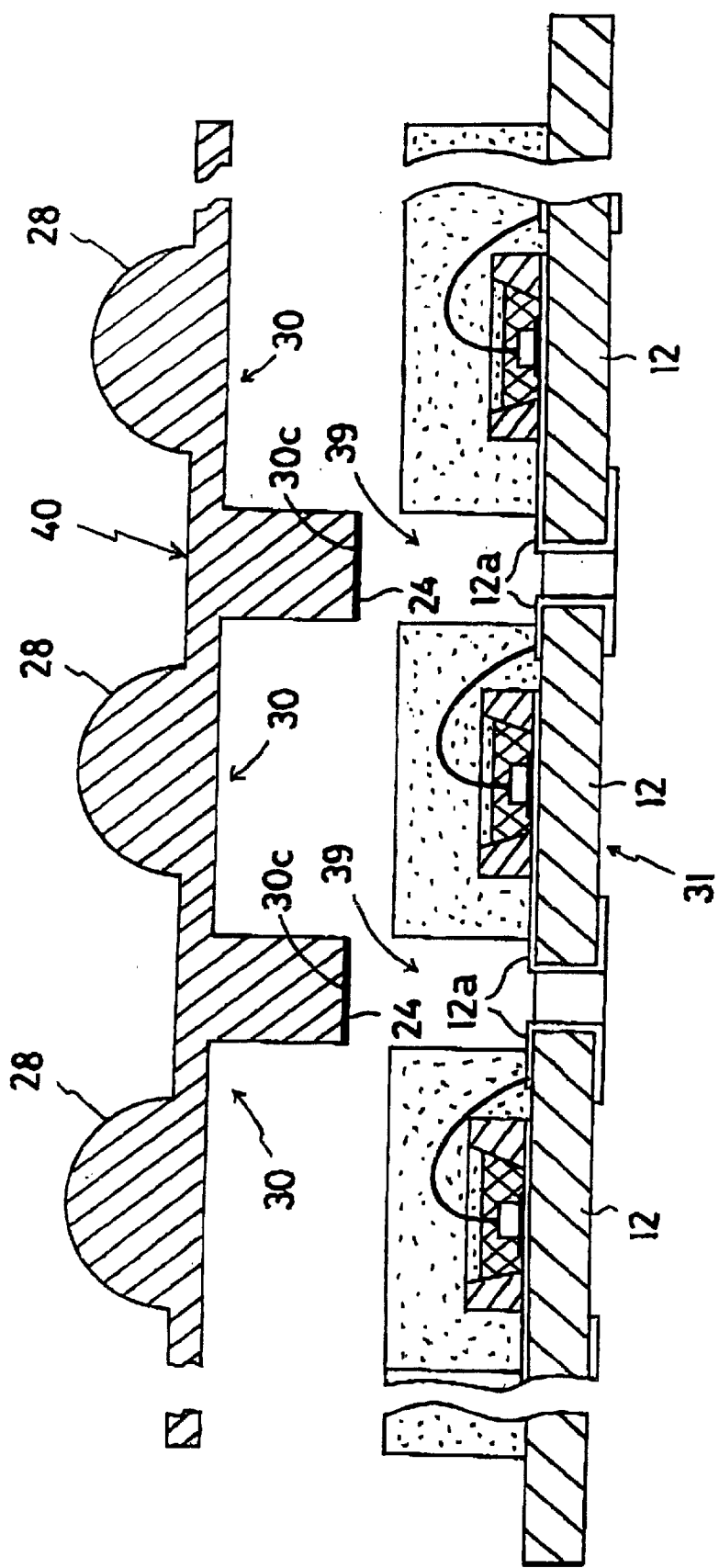
FIG. 22 is a cross-sectional view taken along line E—E in FIG. 21.

FIGS. 21 and 22 show a post-removal state of a mold die 44 (see FIG. 14) for forming each individual second resin encapsulator 27. In a glass epoxy assembled substrate 31, gaps 39 are defined between the adjacent second resin encapsulators 27. Therefore, the outer peripheral portion 12a of the upper surface of each glass epoxy substrate 12 is exposed. On the other hand, the third resin encapsulator 28 are formed as an assembler or aggregate 40 in another process. This assembler 40 is placed from above the glass epoxy assembled substrate 31. Respective concave portions 30 defined in the assembler 40 are fit on their corresponding resin encapsulator 27. The assembler 40 is bonded to their corresponding outer peripheral portions 12a with an adhesive 24 applied onto lower wall surfaces 30c of the assembler 40 in advance being interposed therebetween. Thereafter, the resultant product is inserted into a cure furnace to solidify the adhesive 24.

FIG. 23 shows a state in which the light emitting diode elements 15 placed on the glass epoxy assembled substrate 31 are sealed with a three-layer structure comprising the first resin encapsulators 25, the second resin encapsulators 27 and the third resin encapsulators 28. As shown in FIGS. 21 and 23, such a glass epoxy assembled substrate 31 is diced or sliced in square form along cut lines 41 and 42 extending in X and Y directions supposed on the substrate in advance, so that it is divided into each individual surface-mount type light emitting diodes 11 such as shown in FIG. 17. Each individual surface-mount type light emitting diodes 11 divided as described above are absorbed under vacuum by an automatic mount machine (not shown) so as to be transferred onto a motherboard 18.

Incidentally, any of the embodiments referred to above has described the connecting method using the bonding wires 23. However, the present invention is not necessarily limited to it and may include a connecting method such as flip-chip bonding using solder bumps.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A surface-mount type light emitting diode, comprising:
    a light emitting diode element placed on an upper surface of a glass epoxy substrate and having electrodes;
    a pair of electrodes formed on the glass epoxy substrate; and
    a resin encapsulator for sealing an upper portion of the glass epoxy substrate;
    said electrodes and said pair of electrodes being connected to one another;
    a reflection frame placed around said light emitting diode element;
    a first resin encapsulator mixed with a wavelength-converting material, said first resin encapsulator being charged into said reflection frame to seal said light emitting diode element;
    a second resin encapsulator;
    a third resin encapsulator used as a surface layer; and
    an ultraviolet absorbent mixed into at least said third resin encapsulator; and
    wherein said second resin encapsulator and said third resin encapsulator are superimposed over the glass epoxy substrate including said reflection frame in layer form to seal the entirety of said first resin encapsulator.

2. A surface-mount type light emitting diode according to claim 1, wherein an upper surface of said first resin encapsulator is placed in a position below an upper edge of said reflection frame.

3. A surface-mount type light emitting diode according to claim 1, wherein the wavelength-converting material mixed into said first resin encapsulator is a luminescent material comprising a fluorescent dye or fluorescent pigment.

4. A surface-mount type light emitting diode according to claim 1, wherein said second resin encapsulator is mixed with a diffusing agent for diffusing wavelength-converted light.

5. A surface-mount type light emitting diode according to claim 1, wherein said third resin encapsulator covers the entirety of said second resin encapsulator and is shaped in the form of a cap whose outer peripheral portion is bonded and fixed to the upper surface of said glass epoxy substrate.

6. A surface-mount type light emitting diode according to claim 1, wherein a condenser lens portion is formed on an upper surface of said third resin encapsulator.

7. A surface-mount type light emitting diode according to claim 1, wherein said light emitting diode element is a blue light emitting element comprised of a gallium-nitride system compound semiconductor or a silicon-carbide system compound semiconductor.

8. A method of manufacturing a surface-mount type light emitting diode, comprising the following steps:

a step for bonding and fixing a reflection-frame assembler to an upper surface of a glass epoxy assembled substrate with a pair of electrodes formed thereon;

a step for placing light emitting diode elements inside reflection frames respectively and connecting electrodes of the light emitting diode elements and respective pairs of electrodes formed on the glass epoxy assembled substrate respectively;

a step for charging a first resin encapsulator mixed with a wavelength-converting material into each of the reflection frames to thereby seal each of the light emitting diode elements;

a step for sealing an upper portion of the glass epoxy assembled substrate including each reflection frame with a second resin encapsulator mixed with a diffusing agent;

a step for sealing an upper surface of the second resin encapsulator with a third resin encapsulator mixed with an ultraviolet absorbent; and a step for cutting the glass epoxy assembled substrate along cut lines supposed thereon every sizes of substrates constituting light emitting diodes to thereby divide it into each individual light emitting diodes.

* * * * *